US00RE39999E

(19) United States
(12) Reissued Patent
Lindskog et al.

(10) Patent Number: US RE39,999 E
(45) Date of Reissued Patent: Jan. 8, 2008

(54) COATED TURNING INSERT AND METHOD OF MAKING IT

(75) Inventors: Per Lindskog, Alvsjo (SE); Per Gustafson, Huddinge (SE); Björn Ljungberg, Enskede (SE); Åke Östlund, Hägersten (SE)

(73) Assignee: Sandvik Intellectual Property AB, Sandviken (SE)

(21) Appl. No.: 11/483,380

(22) PCT Filed: Nov. 29, 1996

(86) PCT No.: PCT/SE96/01578

§ 371 (c)(1),
(2), (4) Date: Sep. 1, 1998

(87) PCT Pub. No.: WO97/20082

PCT Pub. Date: Jun. 5, 1997

Related U.S. Patent Documents

Reissue of:
(64) Patent No.: 6,200,671
Issued: Mar. 13, 2001
Appl. No.: 09/077,424
Filed: Sep. 1, 1998

(30) Foreign Application Priority Data

Nov. 30, 1995 (SE) ..... 9504304
Jun. 17, 1996 (SE) ..... 9602413

(51) Int. Cl.
*B23B 27/14* (2006.01)
*C23C 16/30* (2006.01)

(52) U.S. Cl. ..... 428/216; 51/295; 51/307; 51/309; 427/255.1; 427/255.2; 427/255.7; 428/336; 428/698; 428/699; 428/701; 428/702; 428/469; 428/472

(58) Field of Classification Search ..... 51/295, 51/307, 309; 427/255.1, 255.2, 255.7; 428/216, 428/336, 698, 699, 701, 707, 469, 472
See application file for complete search history.

(56) References Cited

U.S. PATENT DOCUMENTS

| | | | | |
|---|---|---|---|---|
| 4,610,931 | A | 9/1986 | Nemeth et al. | 75/241 |
| 4,643,620 | A | 2/1987 | Fujii et al. | |
| 5,137,774 | A | 8/1992 | Ruppi | |
| 5,162,147 | A | 11/1992 | Ruppi et al. | |
| 5,372,873 | A | 12/1994 | Yoshimura et al. | |
| 5,451,469 | A | 9/1995 | Gustafson et al. | 428/548 |
| 5,545,490 | A | 8/1996 | Oshika et al. | 428/698 |
| 5,549,980 | A | 8/1996 | Ostlund et al. | 51/295 |
| 5,576,093 | A | 11/1996 | Yoshimura et al. | |
| 5,652,045 | A | 7/1997 | Nakamura et al. | 428/212 |
| 5,674,464 | A | 10/1997 | Ljungberg et al. | |
| 5,786,069 | A | 7/1998 | Ljungberg et al. | 428/216 |
| 5,915,162 | A | 6/1999 | Uchino et al. | 428/698 |
| 5,920,760 | A | 7/1999 | Yoshimura et al. | 428/551 |

FOREIGN PATENT DOCUMENTS

| | | |
|---|---|---|
| EP | 0653499 | 5/1995 |
| EP | 0685572 | 12/1995 |
| EP | 0686707 | 12/1995 |
| EP | 0693574 | 1/1996 |
| EP | 0709484 | 5/1996 |

OTHER PUBLICATIONS

Patent Abstracts of Japan, vol. 18, No. 392, C–1228, abstract of JP,A, 6–108254 (Mitsubishi Materials Corp), Apr. 19, 1994 & JP,A, 6108254.

Patent Abstract of Japan, vol. 18, No. 203, M–1590, abstract of JP,A, 6–8008 (Mitsubishi Materials Corp), Jan. 18, 1994, & JP,A, 6008008.

*Primary Examiner*—Archene Turner
(74) *Attorney, Agent, or Firm*—Drinker Biddle & Reath LLP

(57) ABSTRACT

A coated turning insert particularly useful for turning in stainless steel is disclosed. The insert is characterized by a WC—Co-based cemented carbide substrate having a highly W-alloyed Co-binder phase and a coating including an inner layer of $TiC_xN_yO_z$ with columnar grains followed by a layer of fine-grained, $\kappa$-$Al_2O_3$ and a top layer of TiN. The layers are deposited by using CVD methods.

19 Claims, No Drawings

COATED TURNING INSERT AND METHOD OF MAKING IT

Matter enclosed in heavy brackets [ ] appears in the original patent but forms no part of this reissue specification; matter printed in italics indicates the additions made by reissue.

*CROSS-REFERENCES TO RELATED APPLICATIONS*

*The present application is a reissue of U.S. Pat. No. 6,200,671 B1, which is a national stage application of PCT/SE96/01578 filed on Nov. 29, 1996, and which claims the benefit of priority to Swedish Application No. 9504304-8 filed Nov. 30, 1995 and to Swedish Application No. 9602413-8 filed Jun. 17, 1996.*

BACKGROUND OF THE INVENTION

The present invention relates to a coated cutting tool (cemented carbide insert) particularly useful for wet turning of toughness-demanding stainless steel components like square bars, flanges and tubes, with raw surfaces such as cast skin, forged skin, hot or cold rolled skin or pre-machined surfaces.

When turning stainless steels with cemented carbide tools, the cutting edge is worn according to different wear mechanisms, such as adhesive wear, chemical wear, abrasive wear and by edge chipping caused by cracks formed along the cutting edge, the so-called comb cracks.

Different cutting conditions require different properties of the cutting insert. For example, when cutting in steels with raw surface zones, a coated cemented carbide insert must consist of a tough carbide and have very good coating adhesion. When turning in stainless steels, the adhesive wear is generally the dominating wear type.

Measures can be taken to improve the cutting performance with respect to a specific wear type. However, very often such action will have a negative effect on other wear properties.

So far it has been very difficult to improve all tool properties simultaneously. Commercial cemented carbide grades have therefore been optimised with respect to one or few of the wear types and hence to specific application areas.

Swedish patent application 9503056-5 which corresponds to U.S. Ser. No. 08/703,965, herein incorporated by reference, discloses a coated cutting insert particularly useful for turning in hot and cold forged low alloyed steel components. The inserts is characterised by a cemented carbide substrate consisting of Co—WC and cubic carbides having a 15-35 μm thick surface zone depleted from cubic carbides, a coating including a layer of $TiC_xN_yO_z$ with columnar grains, a layer of smooth, fine grained κ-$Al_2O_3$, and preferably an outer layer of TiN.

Swedish patent application 09/077,360 9504304-8 which corresponds to U.S. Ser. No. 09/077,360 filed concurrently herewith discloses a coated cutting insert particularly useful for wet and dry milling of low and medium alloyed steels. The insert is characterised by a cemented carbide substrate consisting of Co—WC and cubic carbides, a coating including a layer of $TiC_xN_yO_z$ with columnar grains, a layer of smooth, fine grained κ-$Al_2O_3$ and preferably an outer layer of TiN.

It has now been found that combinations of the substrates and coatings described in the above patent applications give rise to excellent cutting performance in stainless steels turning. A cemented carbide substrate with a cubic carbide depleted surface zone combined with a coating in accordance with patent application, 9503056-5, which corresponds to U.S. Ser. No. 08/703,965, has been found to be especially suitable for high speed turning in easy stainless steel, such as turning of machineability improved 304L. In more difficult work piece materials such as 316-Ti, and in operations with a high degree of thermal cycling such as turning of square bars a straight WC—Co substrate of the type described in patent application 09,077,360 950304-8 which corresponds to U.S. Ser. No. 09/077,360 filed concurrently herewith, has been found the most suitable.

OBJECTS AND SUMMARY OF THE INVENTION

It is an object of this invention to avoid or alleviate the problems of the prior art.

It is further an object of this invention to provide a coated cutting tool particularly useful for wet turning of toughness-demanding stainless steel components.

In one aspect of the invention there is provided a cutting tool insert particularly for turning of steel comprising a cemented carbide body and a coating wherein said cemented carbide body contains WC, 6-15 wt-% Co and 0.2-1.8 wt.-% cubic carbides of Ti, Ta and/or Nb and a highly W-alloyed binder phase with a CW-ratio of 0.78-0.93 and said coating comprises

- a first (innermost) layer of $TiC_xN_yO_z$ with a thickness of <1.5 μm, and with equiaxed grains with size <0.5 μm
- a second layer of $TiC_xN_yO_z$ with a thickness of 2-5 μm with columnar grains with an average diameter of <5 μm and
- an outer layer of a smooth, fine-grained (0.5-2 μm) κ-$Al_2O_3$ with a thickness of 0.5-6 μm.

In another aspect of the invention there is provided a method of making an insert for turning comprising a cemented carbide body and a coating wherein a WC—Co-based cemented carbide body with a highly W-alloyed binder phase with a CW-ratio of 0.78-0.93 is coated with

- a first (innermost) layer of $TiC_xN_yO_z$ with x+y+z=1, with a thickness of 0.1-1.5 μm, with equiaxed grains with size <0.5 μm using known CVD methods
- a second layer of $TiC_xN_yO_z$ with x+y+z=1, with a thickness of 2-8 μm with columnar grains with a diameter of about <5 μm deposited by MTCVD-technique, using acetonitrile as the carbon and nitrogen source for forming the layer in a preferred temperature range of 850°-900° C. and
- a layer of a smooth κ-$Al_2O_3$ with a thickness of 0.5-6 μm.

DETAILED DESCRIPTION OF THE PREFERRED EMBODIMENTS OF THE INVENTION

A turning tool insert according to the invention useful for turning of steel consists of a cemented carbide substrate with a highly W-alloyed binder phase and with a well-balanced chemical composition and grain size of the WC, a columnar $TiC_xN_yO_z$-layer, a κ-$Al_2O_3$-layer, a TiN-layer and optionally followed by smoothening the cutting edges by brushing the edges with, e.g., a SiC-based brush.

The cobalt binder phase is highly alloyed with W. The content of W in the binder phase can be expressed as the [CW-ratio=Ms/(wt % Co 0.0161)] *CW-ratio=$M_s$/(wt % Co 0.0161)*, where $M_s$ is the measured saturation magnetization of the cemented carbide substrate in [kA/m] *$hAm^2/kg$* and wt % Co is the weight percentage of Co in the cemented carbide. The CW-value is a function of the W content in the Co binder phase. A low CW-value corresponds to a high W-content in the binder phase. According to the present invention, improved cutting performance is achieved if the cemented carbide substrate has a CW-ratio of 0.78-0.93.

According to the present invention, a turning tool insert particularly useful for difficult stainless steel turning is provided with a cemented carbide substrate with a composition of 6-15 wt % Co, preferably 9-12 wt % Co, most preferably 10-11 wt % Co, 0.2-1.8 wt % cubic carbides, preferably 0.4-1.8 wt % cubic carbides, most preferably 0.5-1.7 wt % cubic carbides of the metals Ta, Nb and Ti and balance WC. The cemented carbide may also contain other carbides from elements from group IVb, Vb or VIb of the periodic table. The content of Ti is preferably on a level corresponding to a technical impurity. The preferred average grains size of the WC depend on the binder phase content. At the preferred composition of 10-11 wt-% Co, the preferred grain size is 1.5-2 μm, most preferably about 1.7 μm. The CW-ratio shall be 0.78-0.93, preferably 0.80-0.91, and most preferably 0.82-0.90. The cemented carbide may contain small amounts, <1 volume %, of η-phase ($M_6C$), without any detrimental effect. From the CW-value it follows that no free graphite is allowed in the cemented carbide substrate according to the present embodiment.

The coating comprises

- a first (innermost) layer of $TiC_xN_yO_z$ with x+y+z=1, preferably z<0.5, with equiaxed grains with size <0.5 μm and a total thickness of <0.5 μm and preferably >0.1 μm.
- a layer of $TiC_xN_yO_z$ with x+y+z=1, preferably with z=0, and x>0.3 and y>0.3, with a thickness of 1-15 μm, preferably 2-8 μm, with columnar grains and with an average diameter of <5 μm, preferably 0.1-2 μm. Most preferred thickness of the $TiC_xN_yO_z$ layer is 2-5 μm, particularly in extremely edgeline-toughness demanding work-piece materials such as Ti-stabilized stainless steel.
- a layer of a smooth, fine-grained (grain size about 0.5-2 μm) $Al_2O_3$ consisting essentially of the κ-phase. However, the layer may contain small amounts, 1-3 vol-%, of the θ- or the α-phases as determined by XRD-measurement. The $Al_2O_3$-layer has a thickness of 0.5-6 μm, preferably 0.5-3 μm, and most preferably 0.5-2 μm. Preferably, this $Al_2O_3$-layer is followed by a further layer (<1 μm, preferably 0.1-0.5 μm thick) of TiN, but the $Al_2O_3$ layer can be the outermost layer. This outermost layer, $Al_2O_3$ or TiN, has a surface roughness $R_{max}$<0.4 μm over a length of 10 μm. The TiN-layer, if present, is preferably removed along the cutting edge.

According to the method of the invention, a WC-Co-based, cemented carbide substrate is made with a highly W-alloyed binder phase with a CW-ratio of 0.78-0.93, preferably 0.80-0.91, and most preferably 0.82-0.90, a content of cubic carbides of 0.2-1.8 wt %, preferably 0.4-1.8 wt %, most preferably 0.5-1.7 wt % of the metals Ta, Nb and Ti, with 6-15 wt % Co, preferably 9-12 wt % Co, most preferably 10-11 wt % Co, at which Co-content, the WC grain size 1.5-2 μm, most preferably about 1.7 μm. The body is coated with:

- a first (innermost) layer of $TiC_xN_yO_z$ with x+y+z=1, preferably z<0.5, with a thickness of <0.5 μm, and with equiaxed grains with size <0.5 μm using known CVD-methods.
- a layer of $TiC_xN_yO_z$ x+y+z=1, preferably with z=0, and x>0.3 and y>0.3, with a thickness of 1-13 μm, preferably 2-8 μm, with columnar grains and with an average diameter of <5 μm preferably <2 μm, using preferably MTCVD-technique (using acetonitrile as the carbon and nitrogen source for forming the layer in the temperature range of 700-900° C.). The exact conditions, however, depend to a certain extent on the design of the equipment used.
- a smooth $Al_2O_3$-layer essentially consisting of κ-$Al_2O_3$ is deposited under conditions disclosed in, e.g., EP-A-523 021 which corresponds to U.S. Pat. No. 4,674,564, herein incorporated by reference. The $Al_2O_3$ layer has a thickness of 0.5-6 μm, preferably 0.5-3 μm, and most preferably 0.5-2 μm. Preferably, a further layer (<1 μm, preferably 0.1-0.5 μm thick) of TiN is deposited, but the $Al_2O_3$ layer can be the outermost layer. This outermost layer, $Al_2O_3$ or TiN, has a surface roughness $R_{max}$<0.4 μm over a length of 10 μm. The smooth coating surface can be obtained by a gentle wet-blasting of the coating surface with fine-grained (400-150 mesh) alumina powder or by brushing (preferably used when TiN top coating is present) the edges with brushes based on SiC as disclosed in Swedish patent application 9402543-4 which corresponds to U.S. Ser. No. 08/497,934, herein incorporated by reference-end. The-TiN-layer, if present, is preferably removed along the cutting edge.

The invention is additionally illustrated in connection with the following Examples which are to be considered as illustrative of the present invention. It should be understood, however, that the invention is not limited to the specific details of the Examples.

EXAMPLE 1

A. A cemented carbide turning tool insert in style CNMG120408-MM with the composition 10.5 wt-% Co 1.16 wt-% Ta, 0.28 wt-% Nb and balance WC, with a binder phase highly alloyed with W corresponding to a CW-ratio of 0.87, was coated with an innermost 0.5 μm equiaxed TiCN-layer with a high nitrogen content, corresponding to an estimated C/N ratio of 0.05, followed by a 4.3 μm thick layer of columnar TICN deposited using MT-CVD technique. In subsequent steps during the same coating process, a 1.1 μm layer of $Al_2O_3$ consisting of pure κ-phase according to procedure disclosed in EP-A-523 021 which corresponds to U.S. Pat. No. 5,674,564, was used. A thin, 0.5 μm, TiN layer was deposited, during the same cycle, on top of the $Al_2O_3$-layer. The coated insert was brushed by a SiC-containing nylon straw brush after coating, removing the outer TiN layer on the edge.

B. A cemented carbide turning tool insert in style CNMG120408-MM with the composition of 7.5 wt-% Co, 1.8 wt-% TiC, 3.0 wt-% TaC, 0.4 wt-% NbC, balance WC and a CW-ratio of 0.88. The cemented carbide had a surface zone, about 25 μm thick, depleted from cubic carbides. The insert was coated with an innermost 0.5 μm equiaxed TiCN-layer with a high nitrogen content, corresponding to an estimated C/N ratio of 0.05, followed by a 7.2 μm thick layer of columnar TICN deposited using MT-CVD technique. In subsequent steps during the same coating process, a 1.2 μm layer of $Al_2O_3$ consisting of pure κ-phase according to procedure disclosed in EP-A-523 021 which corresponds to U.S. Pat. No. 5,674,564, was used. A thin, 0.5 μm, TiN layer was deposited, during the same cycle, on top of the $Al_2O_3$-layer. The coated insert was brushed by a SiC-containing nylon straw brush after coating, removing the outer TiN layer on the edge.

C. A competitive cemented carbide turning tool insert in style CNMG120408 from an external leading cemented carbide producer was selected for comparison in a turning test. The carbide had a composition of 9.0 wt-% Co, 0.2 wt-% TiC, 1.7 wt-% TaC, 0.2 wt-% NbC, balance WC and a CW-ratio of 0.90. The insert had a coating consisting of 1.0 μm TiC, 0.8 μm TiN, 1.0 μm TiC and, outermost, 0.8 μm TiN. Examination in light optical microscope revealed no edge treatment subsequent to coating.

D. A competitive cemented carbide turning tool insert in style CNMG120408 from an external leading cemented carbide producer was selected for comparison in a turning test. The cemented carbide had a composition of 5.9 wt-% Co, 3.1 wt-% TiC, 5.6 wt-% TaC, 0.1 wt-% NbC, balance WC and a CW-ratio of 0.95. The cemented carbide had a surface zone, about 30 μm thick, which was enriched in Co content. The insert had a coating consisting of 5.3 μm TiC, 3.6 μm TiCN, outermost, 2.0 μm TiN. Examination in light optical microscope revealed no edge treatment subsequent to coating.

E. A competitive cemented carbide turning tool insert in style CNMG120408 from an external leading cemented carbide producer was selected for comparison in a turning test. The carbide had a composition of 8.9 wt-% Co, balance WC and a CW-ratio of 0.84. The insert had a coating consisting with 1.9 μm TiC, 1.2 μTiN, 1.5 μm $Al_2O_3$ laminated with 3 0.1 μm tick layers of TiN, and, outermost, 0.8 μn TiN. Examination in light optical microscope revealed no edge treatment subsequent to coating.

F. A competitive cemented carbide turning tool insert in style CNMG120408 from an external leading cemented carbide producer was selected for comparison in a turning test. The carbide had a composition of 5.4 wt-% Co, 2.7 wt-% TiC, 3.5 wt-% TaC, 2.3 wt-% NbC, balance WC and a CW-ratio of 0.94. The cemented carbide had a surface zone, about 40 μm thick, which was enriched in Co content. The insert had a coating consisting of 5.3 μm TiC, 3.6 μm TiCN, outermost, 2.0 μm TiN. Examination in light optical microscope revealed no edge treatment subsequent to coating.

Inserts from A, B, C, D, E and F were compared in facing of a bar, diameter 180, with two, opposite, flat sides (thickness 120 mm) in 4LR60 material. Feed 0.25 mm/rev, speed 180 m/min and depth of cut 2.0 mm.

The wear mechanism in this test is chipping of the edge. The inserts with gradient substrate (B, E and F) looked good after three cuts but broke suddenly after about four.

| Insert | Number of cuts |
|---|---|
| A (acc. to invent.) | 15 |
| B (outside invention) | 5 |
| C (external grade) | 9 |
| D (external grade) | 9 |
| E (external grade) | 4 |
| F (external grade) | 4 |

EXAMPLE 2

Inserts A, and B from above were selected for a turning test, longitudinal and facing in machineability improved AISI304L stainless steel.

Cutting speed was 250 m/min, feed 0.3 mm/rev and depth of cut 2 mm. Cutting time 1 minute/cycle.

The wear mechanism was plastic deformation.

| Insert | Number of cycles |
|---|---|
| B (outside invention) | 7 |
| A (acc. to invent.) | 4 |

EXAMPLE 3

G. Inserts in geometry TNMG160408-MM with composition and coating according to A above.

H. Inserts in geometry TNMG160408-MM with composition and coating according to B above.

I. Inserts in geometry TNMG160408 with composition and coating according to C above.

The inserts G, H and I were tested in longitudinal, dry, turning of a shaft in duplex stainless steel.

Feed 0.3 mm/rev, speed 140 m/min and depth of cut 2 mm. Total cutting time per component was 12 minutes.

Insert G and I got plastic deformation whereas insert H got some notch wear.

Two edges of insert G were worn out to produce one component whereas one edge of insert H completed one component and four edges were required to finalise one component using insert I.

| Insert | Number of edges/component |
|---|---|
| H (outside invention) | 1 |
| G (acc. to invent.) | 2 |
| I (external grade) | 4 |

EXAMPLE 4

Inserts A and E from above were selected for a turning test, mainly facing, in a cover rotorcase made in cast AISI316 stainless steel. The cutting was interrupted due to component design.

Cutting speed was 180 m/min, feed 0.2 mm/rev and depth of cut 0-2 mm (irregular shape of casting). Cutting time 10.5 minutes/component.

The wear mechanism was a combination of edge chiping and plastic deformation.

| Insert | Number of components |
|---|---|
| A (acc. to invent.) | 2 |
| E (external grade) | 1 |

EXAMPLE 5

Inserts according to A, B, C and D were selected for a turning test. Internal turning of AISI304 stainless steel valve substrate. Cutting speed was 130 m/min and feed 0.4 mm/rev. The stability was poor due to the boring bar.

The wear was chipping of the edge for inserts D and B whereas inserts A and C got plastic deformation.

| Insert | Number of components |
|---|---|
| A (acc. to invent.) | 9 |
| D (external grade) | 7 |
| C (external grade) | 5 |
| B (outside invention) | 2 |

EXAMPLE 6

Inserts A and C from above were selected for a turning test, roughing of a square bar in AISI316Ti stainless steel. The cutting was interrupted due to component design.

Cutting speed was 142 m/min, feed 0.2 mm/rev, depth of cut 4 mm. and cutting time 0.13 minutes/component.

The wear was chipping of the edge.

| Insert | Number of components |
|---|---|
| A (acc. to invent.) | 25 |
| C (external grade) | 15 |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A cutting tool insert particularly for turning of steel comprising a cemented carbide body and a coating wherein said cemented carbide body contains WC, 6-15 wt-% Co and 0.2-1.8 wt % cubic carbides of Ti, Ta and/or Nb and a highly W-alloyed binder phase with a CW-ratio of 0.78-0.93 and said coating comprises a first (innermost) layer of $TiC_xN_yO_z$ with a thickness of <1.5 μm, and with equiaxed grains with size <0.5 μm a second layer of $TiC_xN_yO_z$ with a thickness of 2-5 μm with columnar grains with an average diameter of <5 μm and an outer layer of a smooth, fine-grained (0.5-2 μm) κ-$Al_2O_3$ with a thickness of 0.5-6 μm.

2. The cutting tool inset of claim 1 further comprising an outermost layer of a thin 0.1-1 μm TiN-layer.

3. The cutting tool insert of claim 2 wherein the outermost TiN-layer has been removed along the cutting edge.

4. A method of making an insert for turning comprising a cemented carbide body and a coating wherein a WC—Co-based cemented carbide body with a highly W-alloyed binder phase with a CW-ratio of 0.78-0.93 is coated with a first (innermost) layer of $TiC_xN_yO_z$ with x+y+z=1, with a thickness of 0.1-1.5 μm, with equiaxed grains with size <0.5 μm using known CVD-methods a second layer of $TiC_xN_yO_z$ with x+y+z=1, with a thickness of 2-8 μm with columnar grains with a diameter of about <5 μm deposited by MTCVD-technique, using acetonitrile as the carbon and nitrogen source for forming the layer in a preferred temperature range of 850-900° C. and a layer of a smooth κ-$Al_2O_3$ with a thickness of 0.5-6 μm.

5. The method of claim 4 wherein said cemented carbide body has a cobalt content of 9-12 wt % and 0.4-1.8 wt % cubic carbides of Ta and Nb.

6. The method of claim 5 wherein said cemented carbide body has a cobalt content of 10-11 wt %.

7. The method of claim 4 wherein the CW-ratio is from 0.82-0.90.

8. The method of claim 4 further comprising an outermost TiN-layer which is removed along the cutting edge.

9. The cutting tool insert of claim 1 wherein said cemented carbide body contains 9-12 wt % Co and the CW ratio is 0.80-0.91.

10. The cutting tool insert of claim 1 wherein in the first (innermost) layer of $TiC_xN_yO_z$, z<0.5 and in the second layer of $TiC_xN_yO_z$, z=0, x>0.3 and y>0.3.

11. The method of claim 4 wherein in the first (innermost) layer of $TiC_xN_yO_z$, z<0.5 and in the second layer of $TiC_xN_yO_z$, z=0, x>0.3 and y>0.3.

12. The method of claim 4 wherein the insert contains an outermost layer of TiN with a thickness of <1 μm.

13. The method of claim 12 wherein the CW ratio ranges from 0.82-0.90.

14. The method of claim 12 wherein the outermost TiN-layer is removed along the cutting edge.

*15. The cutting tool of claim 1 wherein said cemented carbide body has a cobalt content of 9-12 wt % and 0.4-1.8 wt % cubic carbides of Ta and Nb.*

*16. The cutting tool of claim 1 wherein said cemented carbide body has a cobalt content of 10-11 wt %.*

*17. The cutting tool of claim 1 wherein the CW-ratio is from 0.82-0.90.*

*18. The cutting tool of claim 2 wherein the CW-ratio is from 0.82-0.90.*

*19. The method of claim 4 wherein said cemented carbide body contains 9-12 wt % Co and the CW ratio is 0.80-0.91.*

* * * * *